(12) United States Patent
Tetzlaff et al.

(10) Patent No.: US 7,902,863 B1
(45) Date of Patent: Mar. 8, 2011

(54) METHODS AND APPARATUS FOR DEVICE-SPECIFIC CONFIGURATION OF A PROGRAMMABLE INTEGRATED CIRCUIT

(75) Inventors: David E. Tetzlaff, Minnetonka, MN (US); Daniel J. Ferris, III, Lakeville, MN (US); Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 72 days.

(21) Appl. No.: 12/049,189

(22) Filed: Mar. 14, 2008

(51) Int. Cl.
*H03K 19/173* (2006.01)

(52) U.S. Cl. .............................. 326/38; 326/41; 326/39; 716/16; 716/6; 716/4

(58) Field of Classification Search ............. 326/37–41, 326/47; 716/16
See application file for complete search history.

(56) References Cited

U.S. PATENT DOCUMENTS

| | | | |
|---|---|---|---|
| 6,262,596 B1 * | 7/2001 | Schultz et al. ................ | 326/41 |
| 6,931,543 B1 * | 8/2005 | Pang et al. ................... | 713/193 |
| 6,943,588 B1 * | 9/2005 | Luo et al. ..................... | 326/86 |
| 7,126,372 B2 * | 10/2006 | Vadi et al. ..................... | 326/38 |
| 7,164,289 B1 * | 1/2007 | Choe et al. .................... | 326/40 |
| 7,644,385 B1 * | 1/2010 | Boyle et al. .................. | 716/16 |

* cited by examiner

*Primary Examiner* — James H. Cho
*Assistant Examiner* — Christopher Lo
(74) *Attorney, Agent, or Firm* — Robert M. Brush; John J. King

(57) ABSTRACT

Methods and apparatus for configuring a programmable integrated circuit are described. In one example, a configuration stream having first data for programming first locations in a configuration memory and an instruction for referencing circuitry in the programmable integrated circuit is received. Second data is obtained from the circuitry based on the instruction. Second locations in the configuration memory are programmed in response to the second data.

15 Claims, 5 Drawing Sheets

US 7,902,863 B1

METHODS AND APPARATUS FOR DEVICE-SPECIFIC CONFIGURATION OF A PROGRAMMABLE INTEGRATED CIRCUIT

FIELD OF THE INVENTION

One or more aspects of the present invention relate generally to programmable integrated circuits and, more particularly, to a method and apparatus for device-specific configuration of a programmable integrated circuit.

BACKGROUND

Programmable logic devices (PLDs) exist as a well-known type of programmable integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) and programmable input/output blocks (IOBs). The CLBs and IOBs are interconnected by a programmable interconnect structure. An FPGA may also include various dedicated logic circuits, such as memories, digital clock managers (DCMs), and input/output (I/O) transceivers. Notably, an FPGA may include one or more embedded processors. The programmable logic of an FPGA (e.g., CLBs, IOBs, and interconnect structure) is typically programmed by loading a stream of configuration data (known as a bitstream) into internal configuration memory cells. The states of the configuration memory cells define how the CLBs, IOBs, interconnect structure, and other programmable logic are configured. Some FPGAs include support for run-time partial reconfiguration, which provides the ability to alter the behavior of portions of a circuit configured in an active FPGA. Partial reconfiguration is useful in systems that must support a wide range of optional behavior, only a subset of which is operational at any point in time.

Presently, configuration of an FPGA device is not unique for that device. That is, the configuration bitstream is not unique for a particular FPGA device. For example, the configuration bitstream does not account for the speed grade, device temperature range, process variations, or other types of characteristics specific to the particular FPGA device. The configuration bitstream also does not account for current environmental factors, such as the current temperature of the FPGA device or the current supply voltage being provided to the device. Such process and environmental characteristics affect the operation of circuitry in the FPGA device and may deleteriously affect a design configured in the device unless compensated. Accordingly, there exists a need in the art for a method and apparatus for device-specific configuration of a programmable integrated circuit, such as PLDs and FPGAs.

SUMMARY

Methods and apparatus for configuring a programmable integrated circuit are described. In one embodiment, a configuration stream having first data for programming first locations in a configuration memory and an instruction for referencing circuitry in the programmable integrated circuit is received. Second data is obtained from the circuitry based on the instruction. Second locations in the configuration memory are programmed in response to the second data. The second locations in the configuration memory can control local circuitry in various locations of the programmable integrated circuit, e.g., input/output drivers or other circuitry where it may be particularly advantageous to have such control. Applications that can benefit from the invention may include, for example, setting an on-chip regulated supply and back-gate voltage to optimize speed or device leakage current (e.g., based on user requirements), or to adjust bias currents or voltage in analog circuitry.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION OF THE DRAWINGS

The present invention is applicable to a variety of integrated circuits (ICs). The present invention has been found to be particularly applicable and beneficial for programmable ICs such as programmable logic devices (PLDs). An appreciation of the present invention is presented by way of specific examples utilizing PLDs such as field programmable gate arrays (FPGAs). However, the present invention is not limited by these examples, and can be applied to virtually any IC that includes programmable resources.

Figure 1:
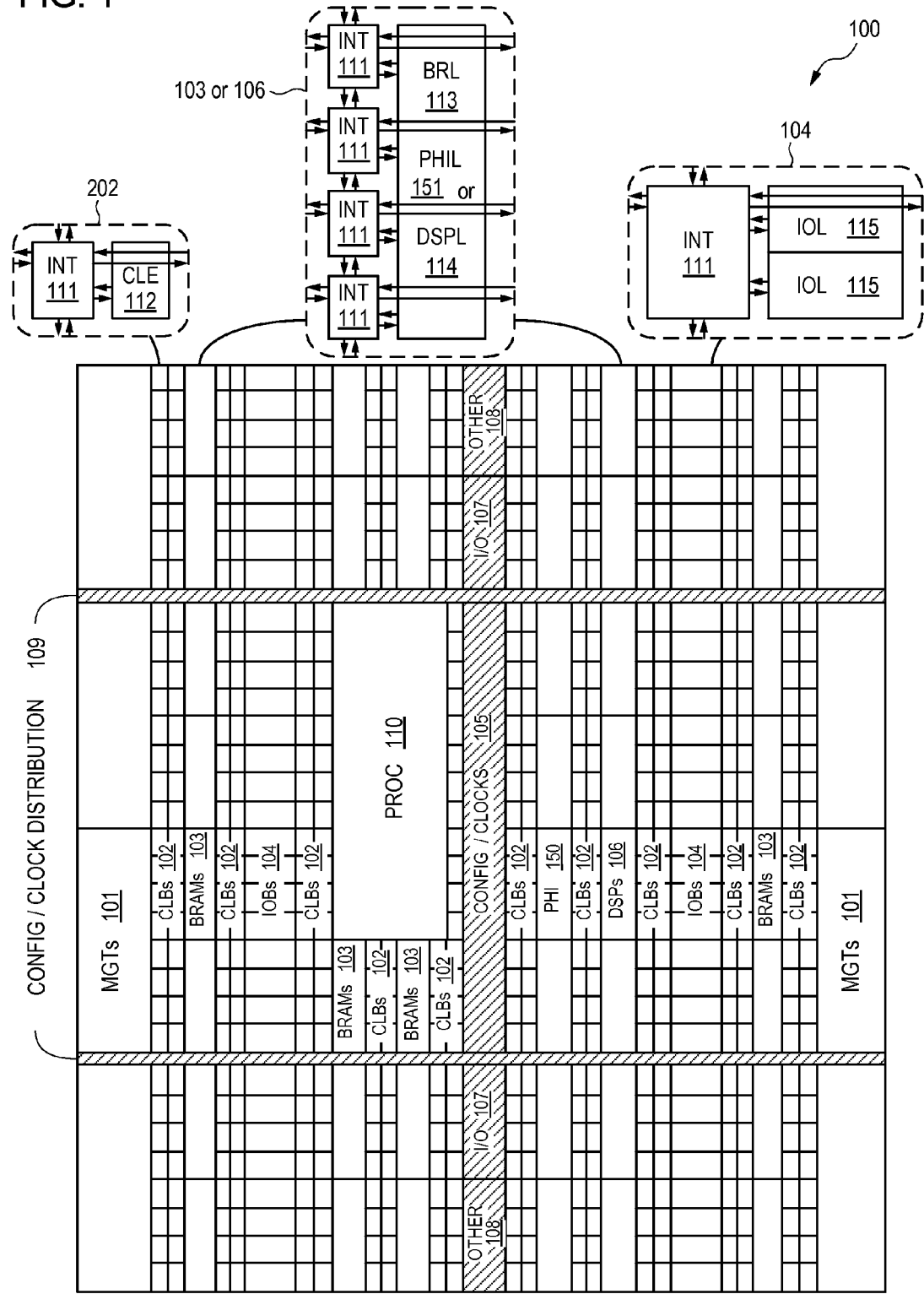
FIG. 1 illustrates an exemplary FPGA architecture.

FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 also includes one or more dedicated processor blocks (PROC 110). The processor block 110 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art. The processor block 110 is coupled to the programmable logic of the FPGA in a well known manner.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the FPGA die. Configuration information for the programmable logic is stored in configuration memory (shown in FIG. 2). The configuration logic 105 provides an interface to, and loads configuration data to, the configuration memory. A stream of configuration data ("configuration bitstream") may be coupled to the configuration logic 105, which in turn loads the configuration memory. Notably, the configuration logic 105 is configured to support the loading of partial configuration bitstreams while the FPGA is active. This allows for reconfiguration of portions of the FPGA during runtime. The configuration and reconfiguration process for the FPGA is well known in the art.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations as well as the location of the blocks within the array included at the top of FIG. 1 are purely exemplary. For example, in an actual FPGA more than one adjacent column of CLBs is typically included wherever the CLBs appear, to facilitate the efficient implementation of user logic.

Figure 2:
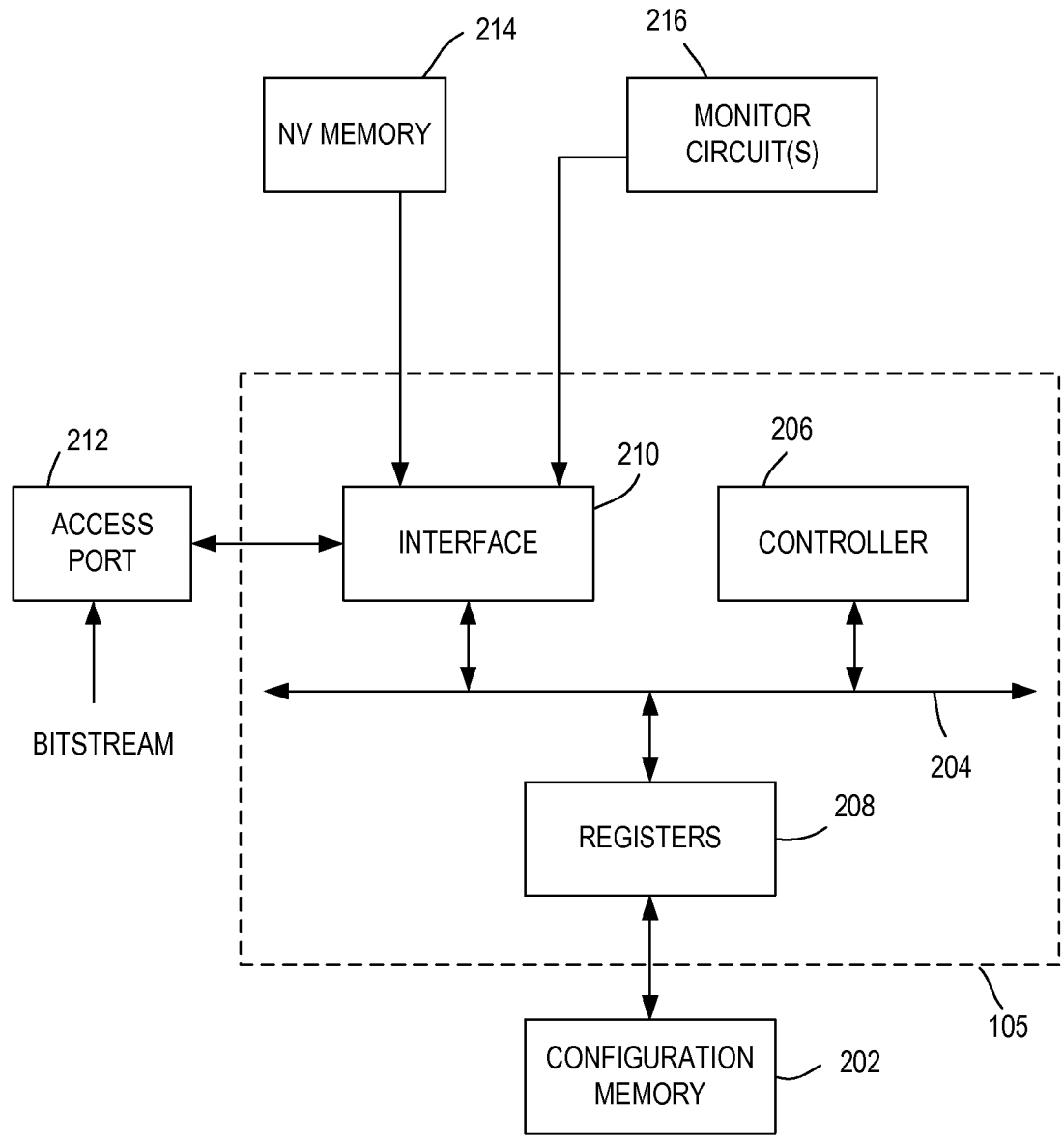
FIG. 2 is a block diagram depicting an exemplary embodiment of the configuration logic adapted for device-specific configuration in accordance with one or more aspects of the invention.

FIG. 2 is a block diagram depicting an exemplary embodiment of the configuration logic 105 adapted for device-specific configuration in accordance with one or more aspects of the invention. The configuration logic 105 is shown coupled to a configuration memory 202. The configuration memory 202 typically includes an array of memory cells (locations) arranged in vertical frames and addressing circuitry for accessing each frame. The vertical frames extend the length (i.e., top to bottom) of the CLB, IOB, BRAM, DSP, MGT, and central columns of the FPGA 100. Multiple frames control each CLB, IOB, BRAM, DSP, MGT, and central column of the FPGA 100. Such structure of the configuration memory 202 is well known in the art.

The configuration logic 105 includes interface logic 210, control logic 206, register logic 208, and a bus 204. The interface logic 210, the control logic 206, and the register logic 208 are each coupled to the bus 204 for communication. The interface logic 210 may include one or more external interfaces, which may be serial or parallel. For example, the interface logic 210 may include a well-known JTAG interface. The interface logic 210 is coupled to an access port 212 for receiving configuration streams (bitstreams). The interface logic 210 may also include one or more internal interfaces (i.e., interfaces to logic within the FPGA). In the present embodiment, the interface logic 210 includes an internal interface to a non-volatile memory 214 and/or an internal interface to one or more monitor circuits 216 (described below). In some embodiments, the non-volatile memory is implemented using EFUSE technology.

The configuration process is initiated by loading data from the configuration stream into the register logic 208. The configuration stream includes command words and/or control data and configuration data. The register logic 208 includes one or more registers for storing the instructions, as well as one or more registers for writing and reading configuration data to and from the configuration memory 202. The control logic 206 operates in accordance with the command words/control data stored in the register logic 208. The control logic 206 coordinates communication between the register logic 208 and the configuration memory 202 based on particular instructions. The control logic 206 is further configured to obtain data from the non-volatile memory 214 and/or the monitor circuit(s) 216 through the interface 210 based on an instruction, as described below.

One or more aspects of the invention relate to device-specific configuration of FPGAs that can be unique for each silicon chip that is manufactured, as well as be related to the operating environment for each such chip. The device-specific configuration can be used to compensate for process variations, such as device temperature range, transistor characteristics, and like type characteristics of a specific silicon device, and/or for environmental variations, such as supply voltage, operating temperature, and the like.

Figure 3:
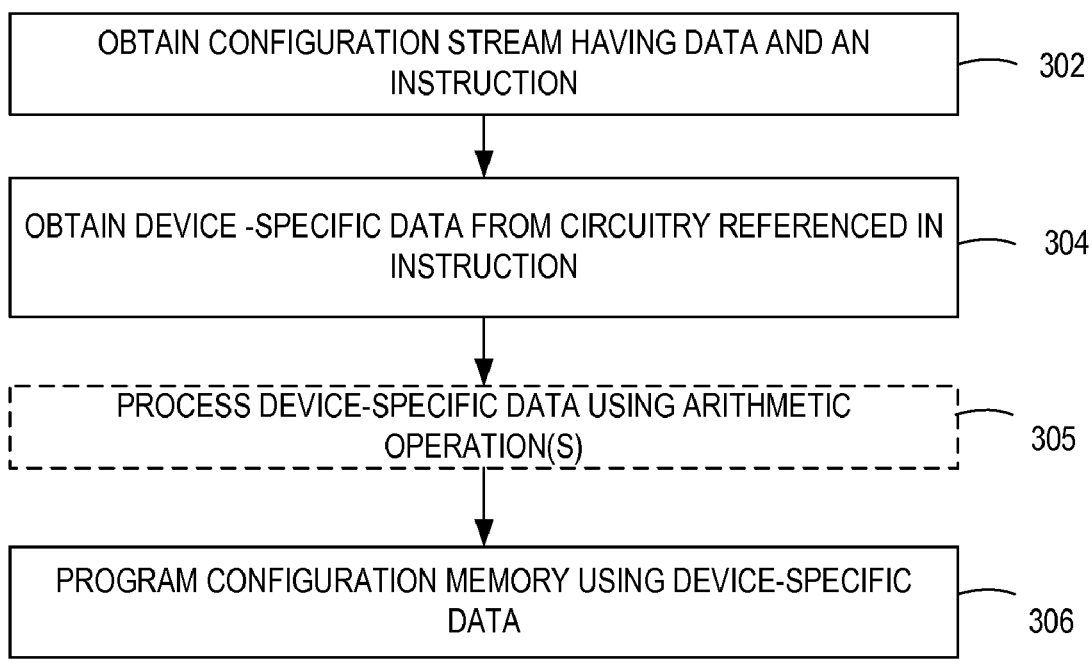
FIG. 3 is a flow diagram depicting an exemplary embodiment of a method of configuring a programmable integrated circuit (IC), in accordance with one or more aspects of the invention.

FIG. 3 is a flow diagram depicting an exemplary embodiment of a method 300 of configuring a programmable integrated circuit such as a PLD in accordance with one or more aspects of the invention. The method 300 begins at step 302, where the interface 210 receives a configuration stream having data for programming locations in the configuration memory 202 and an instruction for referencing circuitry in the PLD. At step 304, device-specific data is obtained from the referenced circuitry based on the instruction. In one embodiment, the instruction includes one or more references to one or more locations in the non-volatile memory 214. Notably, the term "instruction" is meant include control data disposed in one or more positions within the configuration stream. The non-volatile memory 214 includes device-specific data at the referenced locations. The instruction may be loaded into the registers 208, which causes the controller 206 to obtain the device-specific data from the referenced locations. The device-specific data may be used to program attributes of logic tiles in the PLD based on process characteristics and/or environmental characteristics. The device-specific data may be programmed in the non-volatile memory 214 at manufacture of the PLD, for example, during production test.

In another embodiment, the instruction includes one or more references to one or more of the monitoring circuits 216. The monitoring circuits 216 are configured to measure one or more parameters in the PLD, such as transistor characteristics, operating temperature, and the like. The instruction may be loaded into the registers 208, which causes the controller 206 to obtain device-specific data from the referenced monitor circuits. The device-specific data may be used to program attributes of logic tiles in the PLD based on the measured process characteristics and/or environmental characteristics. For example, the device-specific data may be used to set an on-chip regulated power supply and back-gate voltage to optimize speed. The device-specific data may be used to optimize device leakage current (possibly based on user requirements), adjust bias currents, and/or voltages used by analog circuits. In yet another embodiment, the instruction includes references to both the non-volatile memory 214 and the monitor circuit(s) 216.

Optional step 305 is described below.

At step 306, the obtained device-specific data is used to program locations of the configuration memory 202. In one embodiment, the device-specific data may be stored in particular locations in the configuration memory 202 in order to program attributes of logic tiles in the PLD (e.g., CLBs, IOBs, etc.) that are affected by process characteristics and/or environmental characteristics. In particular, the controller 206 causes the device-specific data to be stored in the registers 208 along with the appropriate addressing data. The device-specific data is then loaded into the configuration memory 208 based on the addressing data.

Figure 4:
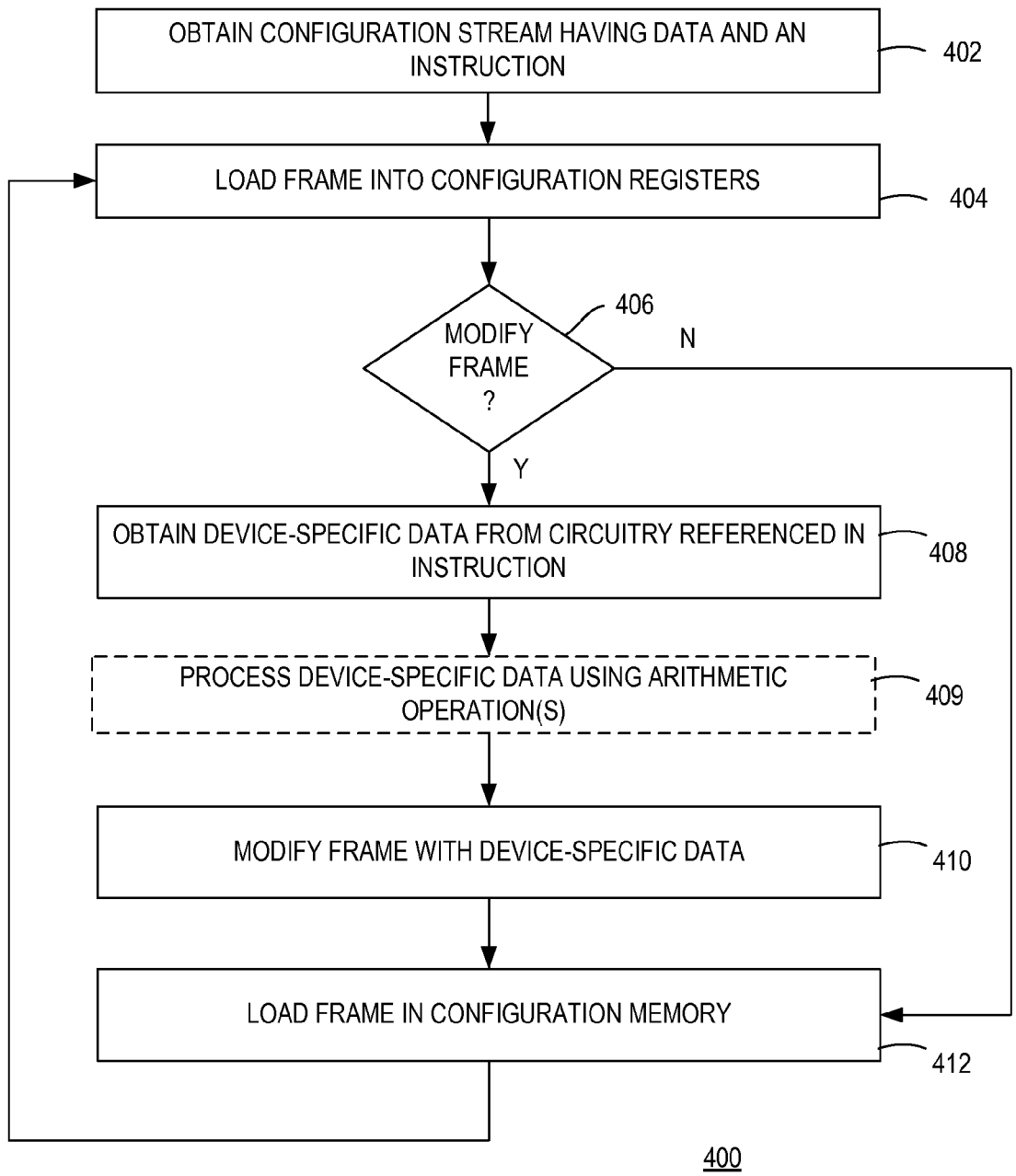
FIG. 4 is a flow diagram depicting another exemplary embodiment of a method for configuring a programmable IC, in accordance with one or more aspects of the invention.

FIG. 4 is a flow diagram depicting another exemplary embodiment of a method 400 for configuring a programmable integrated circuit such as a PLD in accordance with one or more aspects of the invention. The method 400 begins at step 402, where the interface 210 receives a configuration stream having data for programming frames in the configuration memory 202 and an instruction for referencing circuitry in the PLD. As described above, the configuration memory 202 typically includes an array of memory cells arranged in vertical frames. At step 404, a frame is loaded into the registers 208. At step 406, a determination is made whether the instruction in the configuration stream is configured to modify the frame. As described above, the instruction may include control data disposed in one or more locations in the configuration stream, each control data having one or more references to circuitry in the PLD. In the present embodiment, each control data may be associated with a particular frame in the configuration stream.

If the instruction is configured to modify the frame, the method 400 proceeds to step 408. At step 408, device-specific data is obtained from the referenced circuitry based on the instruction. The device-specific data may be obtained from the non-volatile memory 214 and/or from the monitor circuit(s) 216, as described above. Optional step 409 is described below.

At step 410, the frame is modified with the device-specific data. In one embodiment, the instruction modifies a portion (e.g., one or more bits) of the frame with the device-specific data. At step 412, the frame is loaded into the configuration memory 202. The method 400 then returns to step 404 and repeats for another frame. If at step 406 the instruction does not modify the frame, the method 400 skips to step 412, where the frame is loaded into the configuration memory 202 without modification.

In the embodiments above, the device-specific data is loaded directly into the configuration memory 202 without modification. In other embodiments, the device-specific data may be processed before being used as configuration data. In one embodiment, the device-specific data is processed using one or more arithmetic operations, and the result thereof is stored in the configuration memory 202. The arithmetic operations may use device-specific data from the non-volatile memory 214, the monitor circuit(s) 216, or both. For example, the instruction in the configuration stream may specify the equation $y=m*x+b$, where y is the result to be stored in the configuration memory 202, m and b are constants obtained from the non-volatile memory 214, and x is a variable generated by the monitoring circuit(s) 216. The above-described equation is merely one of a myriad of possible arithmetic operations that may be used.

With respect to FIG. 3, at optional step 305, the device-specific data is processed using one or more arithmetic operations. At step 306, the result of the arithmetic operation(s) may be stored in the configuration memory 202. With respect to FIG. 4, at optional step 409, the device-specific data is processed using one or more arithmetic operations. At step 410, a portion of the frame is modified with the result of the arithmetic operation(s).

Figure 5:
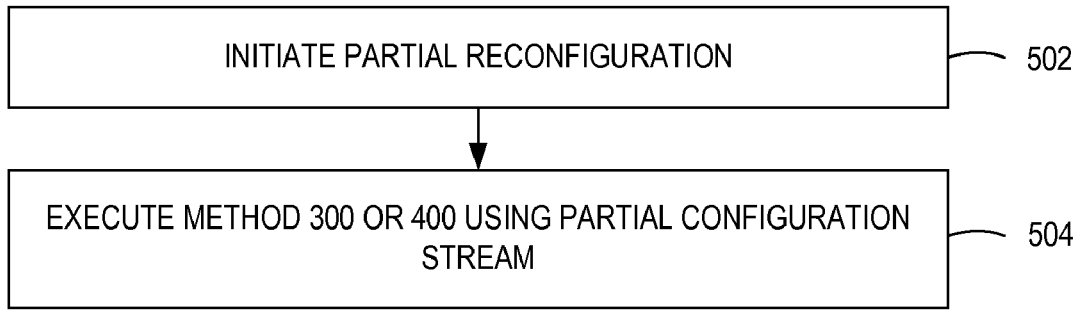
FIG. 5 is a flow diagram depicting yet another exemplary embodiment of a method for configuring a programmable IC, in accordance with one or more aspects of the invention.

In the embodiments described above, the configuration stream may be obtained at power-up of the PLD. FIG. 5 is a flow diagram depicting another exemplary embodiment of a method 500 for configuring a programmable integrated circuit such as a PLD in accordance with one or more aspects of the invention. In the present embodiment, the configuration stream is obtained during a partial reconfiguration of the PLD. The method 500 begins at step 502, where a partial reconfiguration operation is initiated. The partial reconfiguration operation may be initiated periodically or on-demand by a user directive. Alternatively or additionally, the partial reconfiguration operation may be initiated based on an environmental factor. For example, an environmental factor such as a significant change in temperature or supply voltage as measured by the monitor circuit(s) 216 may be used to trigger a partial reconfiguration operation. At step 504, the method 300 or the method 400 is performed as described above, but with respect to a partial configuration stream and partial reconfiguration of the PLD. In this manner, the PLD can be uniquely configured using device-specific configuration data and then dynamically adjusted after initial configuration. The device-specific configuration and possible dynamic adjustment thereof may be used to improve performance of the device and compensate for process and/or environmental variations.

Figure 6:
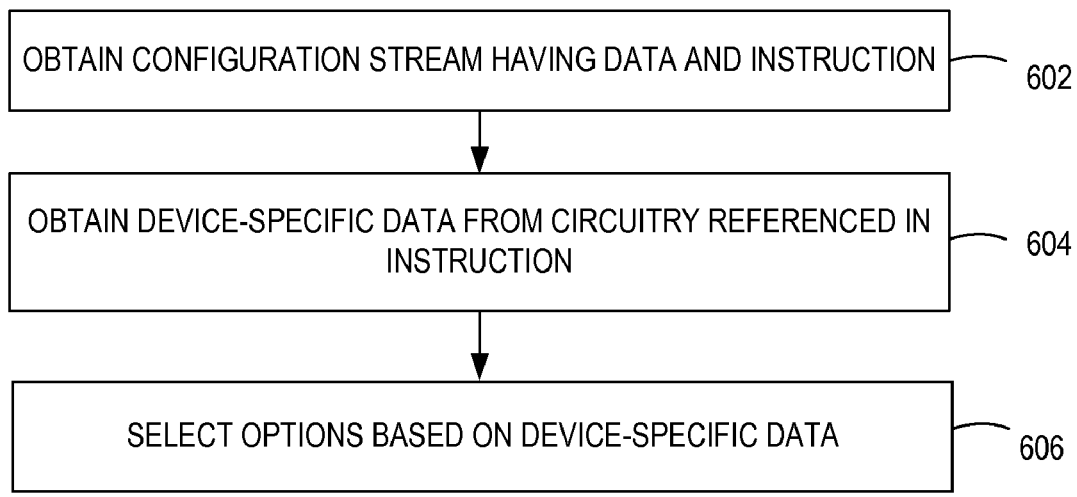
FIG. 6 is a flow diagram depicting another exemplary embodiment of a method for configuring a programmable IC, in accordance with one or more aspects of the invention.

FIG. 6 is a flow diagram depicting another exemplary embodiment of a method 600 of configuring a programmable integrated circuit such as a PLD in accordance with one or more aspects of the invention. The method 600 begins at step 602, where the interface 210 receives a configuration stream having data for programming locations in the configuration memory 202 and at an instruction for referencing circuitry in the PLD. In the present embodiment, the configuration data includes a plurality of options for a particular attribute or attributes of one or more logic tiles. The instruction is configured to cause selection of one of the options based on value(s) obtained from the referenced circuitry. At step 604, device-specific data is obtained from the referenced circuitry based on the instruction. The device-specific data may be obtained from the non-volatile memory 214 and/or the monitor circuit(s) 216, as described above. The device-specific data allows selection of one of the options in the configuration data based on operating conditions and/or silicon characteristics, such as transistor characteristics. At step 606, options are selected based on the device-specific data. In one embodiment, the selection may be performed by the controller 206 and the selected option(s) are loaded into the configuration memory 202. Alternatively, all of the options for the attribute(s) may be loaded into the configuration memory 202 along with the device-specific data and multiplexing logic is configured to select one of the options based on the device specific data.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. A method of configuring a programmable integrated circuit, comprising:
   receiving a configuration stream having first data for programming first locations in a configuration memory and an instruction for referencing circuitry in the programmable integrated circuit;
   obtaining second data from the circuitry based on the instruction, the second data including device-specific data configured to compensate for at least one of process characteristics or environmental characteristics of the programmable integrated circuit; and
   programming second locations in the configuration memory with the second data to adjust attributes of at least one tile in a fabric of the programmable integrated circuit;
   wherein the first locations and the second locations comprise a frame of the programmable integrated circuit, wherein the first data programs the frame, and wherein the instruction modifies a portion of the frame by causing the second locations to be programmed in response to the second data.

2. The method of claim 1, wherein the circuitry comprises a non-volatile memory, the second data being stored in at least one location of the non-volatile memory, the instruction including a reference to the at least one location of the non-volatile memory.

3. The method of claim 1, wherein the circuitry comprises a monitoring circuit, the monitoring circuit generating the second data based on at least one measured parameter.

4. The method of claim 1, wherein the step of programming comprises:
   storing the second data into the second locations of the configuration memory.

5. The method of claim 1, wherein the step of programming comprises:
   processing the second data using at least one arithmetic operation to produce third data; and
   storing the third data into the second locations of the configuration memory.

6. The method of claim 1, wherein the configuration stream comprises a partial configuration stream for active partial reconfiguration of the programmable integrated circuit, and wherein the partial configuration stream is received in response to a trigger.

7. The method of claim 6, wherein the trigger is generated based on a periodic schedule or an environmental condition.

8. The method of claim 1, wherein the instruction includes multiple value options for an attribute of the at least one tile, and wherein the step of programming comprises selecting one of the multiple value options based on the second data, the second locations being programmed using the selected one of the multiple value options.

9. An apparatus for configuring a programmable integrated circuit, comprising:
   an interface configured to receive a configuration stream having first data for programming first locations in a configuration memory and an instruction;
   circuitry, coupled to the interface, configured to provide second data related to at least one of process characteristics of the programmable integrated circuit or environmental characteristics of the programmable integrated circuit;
   a controller, coupled to the interface, configured to obtain the second data from the circuitry based on the instruction, to process the second data using at least one arithmetic operation to produce third data, and to store the third data in the second locations of the configuration memory to adjust attributes of at least one tile in a fabric of the programmable integrated circuit.

10. The apparatus of claim 9, wherein the circuitry comprises a non-volatile memory, the second data being stored in at least one location of the non-volatile memory, the instruction including a reference to the at least one location of the non-volatile memory.

11. The apparatus of claim 9, wherein the circuitry comprises a monitoring circuit, the monitoring circuit configured to generate the second data based on at least one measured parameter.

12. The apparatus of claim 9, wherein the controller is configured to store the second data into the second locations of the configuration memory.

13. A programmable integrated circuit, comprising:
   a fabric having a plurality of tiles;
   a configuration memory configured to program the plurality of tiles;
   an interface configured to receive a configuration stream having first data for programming first locations in the configuration memory and an instruction;
   circuitry, coupled to the interface, configured to provide second data related to at least one of process characteristics of the programmable integrated circuit or environmental characteristics of the programmable integrated circuit; and
   a controller, coupled to the interface, configured to obtain the second data from the circuitry based on the instruction and to program second locations in the configuration memory with the second data to configure attributes of the plurality of tiles;
   wherein the circuitry comprises a non-volatile memory, the second data being stored in at least one location of the non-volatile memory, and the instruction including a reference to the at least one location of the non-volatile memory.

14. The programmable integrated circuit of claim 13, wherein the non-volatile memory is located proximate a center of the fabric.

15. The programmable integrated circuit of claim 13, wherein the circuitry comprises a monitoring circuit, the monitoring circuit configured to generate the second data based on at least one measured parameter.

* * * * *